US012791941B2

(12) United States Patent
Shirakawa

(10) Patent No.: US 12,791,941 B2
(45) Date of Patent: Nov. 10, 2026

(54) FLEXOGRAPHIC PRINTING PLATE PRECURSOR AND MANUFACTURING METHOD OF FLEXOGRAPHIC PRINTING PLATE

(71) Applicant: FUJIFILM Corporation, Tokyo (JP)

(72) Inventor: Masato Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 528 days.

(21) Appl. No.: 18/455,231

(22) Filed: Aug. 24, 2023

(65) Prior Publication Data

US 2023/0408924 A1 Dec. 21, 2023

Related U.S. Application Data

(63) Continuation of application No. PCT/JP2022/007482, filed on Feb. 24, 2022.

(30) Foreign Application Priority Data

Feb. 25, 2021 (JP) ................................ 2021-028725

(51) Int. Cl.
*G03F 7/11* (2006.01)
*B41C 1/10* (2006.01)
(Continued)

(52) U.S. Cl.
CPC .............. *G03F 7/11* (2013.01); *B41C 1/1033* (2013.01); *B41N 1/12* (2013.01); *G03F 7/20* (2013.01);
(Continued)

(58) Field of Classification Search
CPC ... G03F 7/11; G03F 7/20; G03F 7/202; G03F 7/092; B41C 1/1033; B41C 2201/04; B41C 2210/04; B41N 1/12
(Continued)

(56) References Cited

U.S. PATENT DOCUMENTS

RE39,835 E * 9/2007 Kanga ..................... G03F 7/091 430/394
8,991,312 B2 3/2015 Yoshimoto et al.
(Continued)

FOREIGN PATENT DOCUMENTS

JP 2012-137515 A 7/2012
JP 2013-156495 A 8/2013
(Continued)

OTHER PUBLICATIONS

International Preliminary Report on Patentability (with translation of Written Opinion) dated Aug. 29, 2023, issued in International Application No. PCT/JP2022/007482.
(Continued)

*Primary Examiner* — Caleen O Sullivan
(74) *Attorney, Agent, or Firm* — Sughrue Mion, PLLC

(57) ABSTRACT

An object of the present invention is to provide a flexographic printing plate precursor in which occurrence of wrinkles in an infrared ablation layer is suppressed and reproducibility of microcells is improved in a case of being made into a flexographic printing plate, and a manufacturing method of a flexographic printing plate using the flexographic printing plate precursor. The flexographic printing plate precursor of the present invention is a flexographic printing plate precursor including, in the following order, a support, a photosensitive layer, an interlayer, and an infrared ablation layer, in which the interlayer contains a rubber component and a resin component, and the resin component contains at least one of an acrylic resin or a methacrylic resin.

19 Claims, 1 Drawing Sheet

(51) Int. Cl.
*B41N 1/12* (2006.01)
*G03F 7/20* (2006.01)

(52) U.S. Cl.
CPC ...... *B41C 2201/04* (2013.01); *B41C 2210/04* (2013.01)

(58) Field of Classification Search
USPC ........................................................ 430/273.1
See application file for complete search history.

(56) References Cited

U.S. PATENT DOCUMENTS

| | | | | |
|---|---|---|---|---|
| 2004/0087687 | A1* | 5/2004 | Yang .................. | C08G 59/1466 523/451 |
| 2011/0023739 | A1* | 2/2011 | Yoshimoto .............. | G03F 7/202 101/395 |
| 2013/0260121 | A1 | 10/2013 | Inoue et al. | |
| 2022/0043352 | A1 | 2/2022 | Fujiki et al. | |
| 2023/0393480 | A1* | 12/2023 | Kano ........................ | G03F 7/12 |

FOREIGN PATENT DOCUMENTS

| | | | |
|---|---|---|---|
| JP | 2020-140182 | A | 9/2020 |
| WO | 2020/122001 | A1 | 6/2020 |

OTHER PUBLICATIONS

International Search Report (PCT/ISA/210) dated May 17, 2022 issued by the International Searching Authority in International Application No. PCT/JP2022/007482.

Written Opinion (PCT/ISA/237) dated May 17, 2022 issued by the International Searching Authority in International Application No. PCT/JP2022/007482.

European Search Report dated Sep. 18, 2024 in European Application No. 22759694.7.

Communication dated Jul. 9, 2026, in Chinese Application No. 202280016885.7.

* cited by examiner

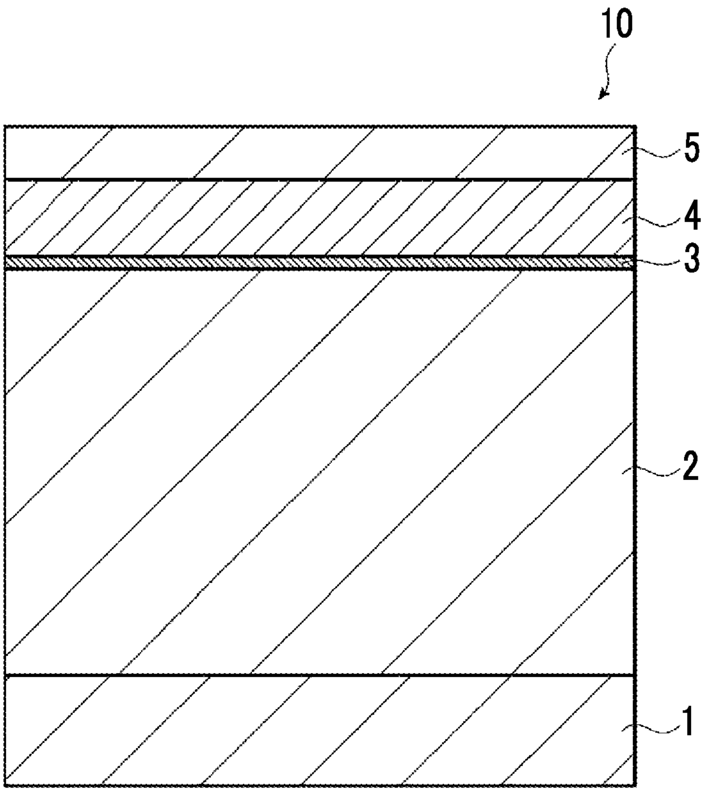
10
5
4
3
2
1

FLEXOGRAPHIC PRINTING PLATE PRECURSOR AND MANUFACTURING METHOD OF FLEXOGRAPHIC PRINTING PLATE

CROSS-REFERENCE TO RELATED APPLICATIONS

This application is a Continuation of PCT International Application No. PCT/JP2022/007482 filed on Feb. 24, 2022, which claims priority under 35 U.S.C. § 119(a) to Japanese Patent Application No. 2021-028725 filed on Feb. 25, 2021. The above applications are hereby expressly incorporated by reference, in their entirety, into the present application.

BACKGROUND OF THE INVENTION

1. Field of the Invention

The present invention relates to a flexographic printing plate precursor and a manufacturing method of a flexographic printing plate using the same.

2. Description of the Related Art

A precursor of a flexographic printing plate generally includes a photosensitive resin layer (photosensitive layer) formed of a photosensitive resin composition on a support formed of a polyester film or the like. The flexographic printing plate is formed by exposing a surface of the photosensitive resin layer of the precursor to a predetermined image and then removing a resin in a portion not exposed.

In a so-called analog-type flexographic printing plate precursor, a negative film on which the predetermined image is already formed is placed on the photosensitive layer, and the predetermined image is exposed on the surface of the photosensitive layer through this negative film.

On the other hand, in a laser ablation mask (LAM)-type flexographic printing plate precursor, an infrared ablation layer is provided in advance on the photosensitive layer, an infrared laser is used to draw digitized negative image information directly onto the infrared ablation layer to produce a desired negative pattern, and then the predetermined image is exposed on the surface of the photosensitive layer through this negative pattern.

As such a LAM-type flexographic printing plate precursor, for example, JP2012-137515A discloses a flexographic printing plate precursor in which a support, a photosensitive resin layer, and an infrared ablation layer containing a binder polymer and an infrared absorbing substance are laminated.

SUMMARY OF THE INVENTION

Regarding the known flexographic printing plate precursor disclosed in JP2012-137515A and the like, from the viewpoint of improving ink transferability of a flexographic printing plate, the present inventors have attempted to form a fine uneven pattern (hereinafter, also abbreviated as "microcell") on a surface of an image area of the flexographic printing plate.

Specifically, in a case where an oxygen blocking layer (interlayer) described in WO2017/056763A and the like is provided on the photosensitive layer, although it has been found that reproducibility of the microcells is improved in a case of being made into a flexographic printing plate, it has been clarified that wrinkles occur in an infrared ablation layer.

Therefore, an object of the present invention is to provide a flexographic printing plate precursor in which occurrence of wrinkles in an infrared ablation layer is suppressed and reproducibility of microcells is improved in a case of being made into a flexographic printing plate, and a manufacturing method of a flexographic printing plate using the flexographic printing plate precursor.

As a result of intensive studies to achieve the above-described object, the present inventor has found that, in a flexographic printing plate precursor including, in the following order, a support, a photosensitive layer, an interlayer containing a rubber component and a predetermined resin component, and an infrared ablation layer, occurrence of wrinkles in the infrared ablation layer is suppressed and reproducibility of microcells is improved in a case of being made into a flexographic printing plate, and has completed the present invention.

That is, the present inventor has found that the above-described object can be achieved by adopting the following configurations.

[1] A flexographic printing plate precursor comprising, in the following order:
- a support;
- a photosensitive layer;
- an interlayer; and
- an infrared ablation layer,
- in which the interlayer contains a rubber component and a resin component, and
- the resin component contains at least one of an acrylic resin or a methacrylic resin.

[2] The flexographic printing plate precursor according to claim 1,
- in which the interlayer further contains an oxygen scavenging agent or inorganic layered particles.

[3] The flexographic printing plate precursor according to [2],
- in which the oxygen scavenging agent is at least one compound selected from the group consisting of a phosphite compound, a phosphine compound, and a thioether compound.

[4] The flexographic printing plate precursor according to [2],
- in which the inorganic layered particles are at least one kind selected from the group consisting of mica, talc, teniolite, montmorillonite, saponite, hectorite, and zirconium phosphate.

[5] The flexographic printing plate precursor according to any one of [1] to [4],
- in which a glass transition temperature of the resin component is 48° C. to 80° C.

[6] The flexographic printing plate precursor according to any one of [1] to [5],
- in which a mass ratio of the rubber component to the resin component is in a range of 1/3 to 3/1.

[7] A manufacturing method of a flexographic printing plate having a non-image area and an image area, the manufacturing method comprising:
- a mask forming step of, with respect to the flexographic printing plate precursor according to any one of [1] to [6], forming an image on the infrared ablation layer included in the flexographic printing plate precursor to form a mask;

an exposure step of, after the mask forming step, imagewise exposing the photosensitive layer included in the flexographic printing plate precursor through the mask; and a development step of, after the exposure step, performing development using a developer to form a non-image area and an image area.

According to the present invention, it is possible to provide a flexographic printing plate precursor in which occurrence of wrinkles in an infrared ablation layer is suppressed and reproducibility of microcells is improved in a case of being made into a flexographic printing plate, and a manufacturing method of a flexographic printing plate using the flexographic printing plate precursor.

BRIEF DESCRIPTION OF THE DRAWINGS

FIG. 1 is a schematic cross-sectional view showing an example of a flexographic printing plate precursor according to the embodiment of the present invention.

DESCRIPTION OF THE PREFERRED EMBODIMENTS

Hereinafter, the present invention will be described in detail.

The description of configuration requirements described below may be made on the basis of representative embodiments of the present invention, but it should not be construed that the present invention is limited to those embodiments.

In the specification of the present application, the numerical range expressed by using "to" means a range including the numerical values before and after "to" as the lower limit value and the upper limit value.

In addition, in this specification, for each component, one kind of substance corresponding to each component may be used alone, or two or more kinds thereof may be used in combination. Here, in a case where two or more kinds of substances are used in combination for each component, the content of the component indicates the total content of the substances used in combination, unless otherwise specified.

[Flexographic Printing Plate Precursor]

The flexographic printing plate precursor according to the embodiment of the present invention is a flexographic printing plate precursor having, in the following order, a support, a photosensitive layer, an interlayer, and an infrared ablation layer.

In addition, the above-described interlayer contains a rubber component and a resin component.

In addition, the above-described resin component contains at least one of an acrylic resin or a methacrylic resin.

FIG. 1 is a schematic cross-sectional view showing an example of the flexographic printing plate precursor according to the embodiment of the present invention.

A flexographic printing plate precursor 10 shown in FIG. 1 includes a support 1, a photosensitive layer 2, an interlayer 3, and an infrared ablation layer 4 in this order.

In addition, as shown in FIG. 1, the flexographic printing plate precursor according to the embodiment of the present invention may include a cover sheet 5.

In the present invention, since the interlayer included in the flexographic printing plate precursor contains the rubber component and the resin component and contains, as the resin component, at least one of an acrylic resin or a methacrylic resin, occurrence of wrinkles in the infrared ablation layer is suppressed and reproducibility of microcells is improved in a case of being made into a flexographic printing plate.

Although the details thereof are not clear, the present inventor has presumed as follows.

First, it is considered that the reason why the reproducibility of the microcells is improved in a case of being made into a flexographic printing plate is that, by providing the above-described interlayer, inhibition of polymerization by oxygen is suppressed compared to a case of not providing the interlayer. This can be presumed from the fact that the reproducibility of the microcells is improved in a case where an oxygen scavenging agent or the like is blended in the interlayer.

On the other hand, it is considered that the wrinkles in the infrared ablation layer occur due to the following causes.

That is, since the oxygen blocking layer described in WO2017/056763A above has weak adhesiveness with the adjacent photosensitive layer and infrared ablation layer, in a case where stress is applied to the flexographic printing plate precursor, wrinkles occur in the oxygen blocking layer, and as a result, wrinkles also occur in the infrared ablation layer.

Therefore, in the present invention, by containing a rubber component and a predetermined resin component in the above-described interlayer, the adhesiveness with the adjacent photosensitive layer and infrared ablation layer is improved, and by preventing plastic deformation of the interlayer in a case where stress is applied to the flexographic printing plate precursor, wrinkles are less likely to occur in the interlayer. Accordingly, it is considered that the occurrence of wrinkles in the infrared ablation layer is suppressed.

Hereinafter, each layer configuration included in the flexographic printing plate precursor according to the embodiment of the present invention will be described in detail.

[Support]

A material used for the support included in the flexographic printing plate precursor according to the embodiment of the present invention is not particularly limited, and a support with high dimensional stability is preferably used. Examples thereof include metals such as steel, stainless steel, and aluminum; polyester (for example, polyethylene terephthalate (PET), polybutylene terephthalate (PBT), polyethylene naphthalate (PEN), polyimide (PI), polyamide, liquid crystal polymer (LCP), and polyacrylonitrile (PAN)); plastic resins such as polyvinyl chloride; synthetic rubber such as styrene-butadiene rubber; glass fiber reinforced plastic resin (such as epoxy resin and phenolic resin); and cloth and paper.

From the viewpoint of dimensional stability and availability, the support is preferably a polymer film or cloth, and more preferably a polymer film. The morphology of the support is determined by whether the polymer layer is sheet-like or sleeve-like.

As the cloth, plain or twill weave fabrics and various knitted fabrics of natural fibers such as cotton, linen, silk, and wool or synthetic fibers such as acetate, vinylon, vinylidene, polyvinyl chloride, acrylic, polypropylene, polyethylene, polyurethane, fluorine filament, polyclar, rayon, nylon, polyamide, and polyester, or nonwoven fabrics can be used.

Examples of the polymer film include a film formed of various polymers such as polyester (for example, polyethylene terephthalate (PET), polybutylene terephthalate (PBT), polyethylene naphthalate (PEN), polyimide (PI), polyamide, liquid crystal polymer (LCP), and polyacrylonitrile (PAN)), plastic resins such as polyvinyl chloride, synthetic rubber such as styrene-butadiene rubber, and glass fiber reinforced plastic resin (such as epoxy resin and phenolic resin). Among these, from the viewpoint of dimensional stability and the like, a polyester film is preferable.

Examples of the above-described polyester film include a PET film, a PBT film, and a PEN film, and from the viewpoint of dimensional stability and the like, a polyethylene terephthalate (PET) film is preferable.

A film thickness of the support is not particularly limited, but from the viewpoint of dimensional stability and handleability, it is preferably 5 to 3,000 μm, more preferably 50 to 2,000 μm, and still more preferably 100 to 1,000 μm.

[Photosensitive Layer]

The photosensitive layer included in the flexographic printing plate precursor according to the embodiment of the present invention can be formed using a known photosensitive resin composition in the related art.

In the present invention, it is preferable that the photosensitive layer contains water-dispersible particles, a binder, a monomer, a photopolymerization initiator, and a polymerization inhibitor.

<Water-Dispersible Particles>

The water-dispersible particles are not particularly limited, but from the reason that occurrence of wrinkles in an infrared ablation layer is further suppressed and reproducibility of microcells is further improved in a case of being made into a flexographic printing plate, a polymer is preferable. Hereinafter, the "occurrence of wrinkles in an infrared ablation layer is further suppressed and reproducibility of microcells is further improved in a case of being made into a flexographic printing plate" is also referred to as "effects of the present invention are more excellent".

Specific examples of the above-described polymer include diene-based polymers (for example, polybutadiene, natural rubber, styrene-butadiene copolymer, acrylonitrile-butadiene copolymer, methylmethacrylate-butadiene copolymer, polychloroprene, and polyisoprene), polyurethane, vinylpyridine polymer, butyl polymer, thiokol polymer, acrylate polymer, and a polymer obtained by copolymerizing these polymers with other components such as acrylic acid and methacrylic acid. These may be used alone or in combination of two or more.

From the reason that water-based ink resistance is more excellent, the above-described polymer is preferably a polymer obtained by polymerizing at least one monomer selected from the group consisting of isoprene, butadiene, styrene, butyl, ethylene, propylene, acrylic acid ester, and methacrylic acid ester, and more preferably polybutadiene.

It is preferable that the above-described polymer does not have a reactive functional group (for example, a (meth) acryloyloxy group) at both terminals. The term "(meth) acryloyl" is a notation meaning acryloyl or methacryloyl.

From the reason that the effects of the present invention are more excellent, the above-described polymer is a polymer obtained by removing water from water-dispersible latex. Specific examples of the above-described water-dispersible latex include water-dispersible latex of specific examples of the above-described polymer.

From the reason that the effects of the present invention are more excellent, a content of the water-dispersible particles is preferably 5% to 80% by mass, more preferably 10% to 60% by mass, and still more preferably 20% to 45% by mass with respect to the total mass of solid content in the photosensitive layer.

<Binder>

The binder is not particularly limited, and examples thereof include a thermoplastic polymer.

The thermoplastic polymer is not particularly limited as long as the thermoplastic polymer is a polymer exhibiting thermoplasticity, and specific examples thereof include a polystyrene resin, a polyester resin, a polyamide resin, a polysulfone resin, a polyethersulfone resin, a polyimide resin, an acrylic resin, an acetal resin, an epoxy resin, a polycarbonate resin, rubbers, and a thermoplastic elastomer. These may be used alone or in combination of two or more.

Among these, from the reason that an elastic and flexible film can be easily formed, a rubber or a thermoplastic elastomer is preferable, a rubber is more preferable, and a diene-based rubber is still more preferable.

As the above-described rubber, in order to secure elasticity of the flexographic plate, a non-fluid rubber which does not have fluidity is preferable.

Specific examples thereof include butadiene rubber (BR), nitrile rubber (NBR), acrylic rubber, epichlorohydrin rubber, urethane rubber, isoprene rubber, styrene isoprene rubber, styrene butadiene rubber (SBR), ethylene-propylene copolymer, and chlorinated polyethylene. These may be used alone or in combination of two or more. Among these, from the reason that water developability is improved, or from the viewpoint of drying properties and image reproducibility, at least one rubber selected from the group consisting of butadiene rubber (BR), styrene butadiene rubber (SBR), and nitrile rubber (NBR) is preferable, and from the viewpoint of water-based ink resistance, butadiene rubber or styrene butadiene rubber is more preferable.

Examples of the above-described thermoplastic elastomer include a polybutadiene-based thermoplastic elastomer (PB), a polyisoprene-based thermoplastic elastomer, a polyolefin-based thermoplastic elastomer, and an acrylic thermoplastic elastomer. Specific examples thereof include polystyrene-polybutadiene (SB), polystyrene-polybutadiene-polystyrene (SBS), polystyrene-polyisoprene-polystyrene (SIS), polystyrene-polyethylene/polybutylene-polystyrene (SEBS), acrylonitrile butadiene styrene copolymer (ABS), acrylic acid ester rubber (ACM), acrylonitrile-chlorinated polyethylene-styrene copolymer (ACS), acrylonitrile-styrene copolymer, syndiotactic 1,2-polybutadiene, and methyl polymethacrylate-butyl polyacrylate-methyl polymethacrylate. Among these, from the reason that the water developability is improved, or from the viewpoint of drying properties and image reproducibility, PB, SBS, or SIS is particularly preferable.

A content of the binder is preferably 1% to 50% by mass, more preferably 5% to 40% by mass, and still more preferably 7% to 30% by mass with respect to the total mass of solid content in the photosensitive layer.

<Monomer>

The monomer is not particularly limited, but from the reason that the effects of the present invention are more excellent, it is preferable to use a monofunctional monomer and a bifunctional monomer in combination.

(Monofunctional Monomer)

From the reason that the effects of the present invention are more excellent, the above-described monofunctional monomer is preferably a compound having one ethylenically unsaturated group.

Examples of the ethylenically unsaturated group include a radically polymerizable group such as an acryloyl group, a methacryloyl group, a vinyl group, a styryl group, and an allyl group, and among these, an acryloyl group, a methacryloyl group, or $C(O)OCH{=}CH_2$ is preferable, and an acryloyl group or a methacryloyl group is more preferable.

Examples of the compound having one ethylenically unsaturated group include

N-vinyl compounds such as N-vinylformamide;

(meth)acrylamide compounds such as (meth)acrylamide, N-methylol (meth)acrylamide, diacetone (meth)acrylamide, N,N-dimethyl (meth)acrylamide, N,N-diethyl (meth)acrylamide, N-isopropyl (meth)acrylamide, (meth)acryloylmorpholine, and (meth)acrylamide;

(meth)acrylate compounds such as 2-hydroxyethyl (meth) acrylate, butoxyethyl (meth)acrylate, carbitol (meth) acrylate, cyclohexyl (meth)acrylate, tetrahydrofurfuryl (meth)acrylate, benzyl (meth)acrylate, tridecyl (meth) acrylate, 2-phenoxyethyl (meth)acrylate, glycidyl (meth)acrylate, isobornyl (meth)acrylate, dicyclopentenyl (meth)acrylate, dicyclopentenyloxyethyl (meth) acrylate, dicyclopentanyl (meth)acrylate, 2-hydroxy-3-phenoxypropyl (meth)acrylate, 2-(meth)) acryloyloxyethyl phthalate, methoxy-polyethylene glycol (meth)acrylate, 2-(meth)acryloyloxyethyl-2-hydroxyethyl phthalate, 2-(2-ethoxyethoxy)ethyl (meth) acrylate, 2-methoxyethyl (meth)acrylate, 3-methoxybutyl (meth)acrylate, ethoxylated phenyl (meth)acrylate, 2-(meth)acryloyloxyethyl succinic acid, nonylphenol EO-adduct (meth)acrylate, phenoxy-polyethylene glycol (meth)acrylate, 2-(meth)acryloyloxyethylhexahydrophthalic acid, lactone-modified (meth)acrylate, stearyl (meth)acrylate, isoamyl (meth) acrylate, isomyristyl (meth)acrylate, isostearyl (meth) acrylate, and cyclic trimethylolpropane formal (meth) acrylate; and monovinyl ether compounds such as methyl vinyl ether, ethyl vinyl ether, n-propyl vinyl ether, isopropyl vinyl ether, n-butyl vinyl ether, isobutyl vinyl ether, t-butyl vinyl ether, n-octadecyl vinyl ether, 2-ethylhexyl vinyl ether, n-nonyl vinyl ether, dodecyl vinyl ether, octadecyl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethyl cyclohexyl methyl vinyl ether, diethylene glycol monovinyl ether, polyethylene glycol vinyl ether, chlorethyl vinyl ether, chlorobutyl vinyl ether, chloroethoxyethyl vinyl ether, phenylethyl vinyl ether, phenoxypolyethylene glycol vinyl ether, cyclohexanedimethanol monovinyl ether, and isopropenyl ether-O-propylene carbonate.

EO represents ethylene oxide.

From the reason that the effects of the present invention are more excellent, a content of the monofunctional monomer is preferably 0.1% to 30% by mass, and more preferably 1% to 10% by mass with respect to the total mass of solid content in the photosensitive layer.

(Bifunctional Monomer)

From the reason that the effects of the present invention are more excellent, the above-described bifunctional monomer is preferably a compound having two ethylenically unsaturated groups. Specific examples of the above-described ethylenically unsaturated group are as described above.

Examples of the compound having two ethylenically unsaturated groups include glycol di(meth)acrylate compounds such as ethyleneglycol di(meth)acrylate, diethyleneglycol di(meth)acrylate, triethyleneglycol di(meth)acrylate, tetraethyleneglycol di(meth)acrylate, polyethyleneglycol di(meth)acrylate, propyleneglycol di(meth)acrylate, dipropyleneglycol di(meth)acrylate, tripropyleneglycol di(meth)acrylate, tetrapropyleneglycol di(meth)acrylate, polypropyleneglycol di(meth)acrylate, ethoxylated neopentylglycol di(meth)acrylate, and propoxylated neopentylglycol di(meth)acrylate;

divinyl ether compounds such as ethyleneglycol divinyl ether, diethyleneglycol divinyl ether, triethyleneglycol divinyl ether, propyleneglycol divinyl ether, dipropyleneglycol divinyl ether, butanediol divinyl ether, hexanediol divinyl ether, and cyclohexanedimethanol divinyl ether; and di(meth)acrylate compounds of bisphenol A such as bisphenol A diglycidyl ether (meth)acrylic acid adduct, modified bisphenol A di(meth)acrylate, bisphenol A PO-adducted di(meth)acrylate, and bisphenol A EO-adducted di(meth)acrylate.

PO represents propylene oxide and EO represents ethylene oxide.

From the reason that the effects of the present invention are more excellent, a content of the bifunctional monomer is preferably 0.1% to 30% by mass with respect to the total mass of solid content in the photosensitive layer.

<Photopolymerization Initiator>

From the reason that the effects of the present invention are more excellent, the photosensitive layer preferably contains a photopolymerization initiator.

The photopolymerization initiator is not particularly limited, and examples thereof include photopolymerization initiators such as alkylphenones, acetophenones, benzoin ethers, benzophenones, thioxanthones, anthraquinones, benzyls, and biacetyls.

More specific examples thereof include benzyl dimethyl ketal, 2-hydroxy-2-methyl-1-phenyl-propane-1-one, methyl-o-benzoylbenzoate, and 1-hydroxycyclohexyl phenyl ketone.

From the viewpoint of sensitivity or the like, a content of the photopolymerization initiator is preferably 0.3% to 15% by mass and more preferably 0.5% to 10% by mass with respect to the total mass of solid content in the photosensitive layer.

<Polymerization Inhibitor>

From the reason that the effects of the present invention are more excellent, the photosensitive layer preferably contains a polymerization inhibitor (stabilizer).

Examples of the polymerization inhibitor include phenols, hydroquinones, and catechols.

From the reason that the flexographic printing plate precursor after being stored for a long time has more excellent development scum dispersibility, a content of the polymerization inhibitor is preferably 0.01% to 5% by mass and more preferably 0.01% to 0.5% by mass with respect to the total mass of solid contents of the photosensitive layer.

<Telechelic Polymer>

From the reason that the effects of the present invention are more excellent, the photosensitive layer preferably contains a telechelic polymer.

In the present specification, the "telechelic polymer" means a polymer which has a reactive functional group at both terminals.

(Main Chain)

A polymer constituting a main chain of the telechelic polymer is not particularly limited, and examples thereof include a thermoplastic polymer.

The thermoplastic polymer is not particularly limited as long as the thermoplastic polymer is a polymer exhibiting thermoplasticity, and specific examples thereof include a polystyrene resin, a polyester resin, a polyamide resin, a polysulfone resin, a polyethersulfone resin, a polyimide resin, an acrylic resin, an acetal resin, an epoxy resin, a polycarbonate resin, rubbers, and a thermoplastic elastomer.

Among these, from the reason that more elastic and flexible film can be easily formed, a rubber or a thermoplastic elastomer is preferable, a rubber is more preferable, and a diene-based rubber is still more preferable.

Specific examples of the rubber include butadiene rubber (BR), nitrile rubber (NBR), acrylic rubber, epichlorohydrin rubber, urethane rubber, isoprene rubber, styrene isoprene rubber, styrene butadiene rubber (SBR), ethylene-propylene copolymer, and chlorinated polyethylene. These may be used alone or in combination of two or more. Among these, from the reason that water developability is improved, or from the viewpoint of drying properties and image reproducibility, at least one rubber selected from the group consisting of butadiene rubber (BR), styrene butadiene rubber (SBR), and nitrile rubber (NBR) is preferable, and butadiene rubber or styrene butadiene rubber is more preferable.

Examples of the above-described thermoplastic elastomer include a polybutadiene-based thermoplastic elastomer (PB), a polyisoprene-based thermoplastic elastomer, a polyolefin-based thermoplastic elastomer, and an acrylic thermoplastic elastomer. Specific examples thereof include polystyrene-polybutadiene (SB), polystyrene-polybutadiene-polystyrene (SBS), polystyrene-polyisoprene-polystyrene (SIS), polystyrene-polyethylene/polybutylene-polystyrene (SEBS), acrylonitrile butadiene styrene copolymer (ABS), acrylic acid ester rubber (ACM), acrylonitrile-chlorinated polyethylene-styrene copolymer (ACS), acrylonitrile-styrene copolymer, syndiotactic 1,2-polybutadiene, and methyl polymethacrylate-butyl polyacrylate-methyl polymethacrylate. Among these, from the reason that the water developability is improved, or from the viewpoint of drying properties and image reproducibility, PB, SBS, or SIS is particularly preferable.

(Terminal)

The telechelic polymer has a reactive functional group at both terminals.

The above-described reactive functional group is not particularly limited, but from the reason that the effects of the present invention are more excellent, an ethylenically unsaturated group is preferable.

From the reason that the effects of the present invention are more excellent, the above-described ethylenically unsaturated group is preferably a vinyl group ($CH_2$=CH—), an allyl group ($CH_2$=CH—$CH_2$—), or a (meth)acryloyl group, and more preferably a (meth)acryloyloxy group.

The telechelic polymer may have a reactive functional group at both terminals of the polymer constituting the main chain through a divalent linking group.

The above-described divalent linking group is not particularly limited, and examples thereof include a linear, branched, or cyclic divalent aliphatic hydrocarbon group (for example, an alkylene group such as a methylene group, an ethylene group, and a propylene group), a divalent aromatic hydrocarbon group (for example, a phenylene group), —O—, —S—, —$SO_2$—, —NRL-, —CO—, —NH—, —COO—, —CONRL-, —O—CO—O—, —$SO_3$—, —NHCOO—, —$SO_2$NRL-, —NH—CO—NH—, and a group in which two or more of these groups are combined (for example, an alkyleneoxy group, an alkyleneoxycarbonyl group, an alkylenecarbonyloxy group, and the like). Here, RL represents a hydrogen atom or an alkyl group (preferably having 1 to 10 carbon atoms).

(Molecular Weight)

From the reason that the effects of the present invention are more excellent, a weight-average molecular weight (Mw) of the telechelic polymer is preferably 6,000 or more, more preferably 7,000 or more, still more preferably 8,000 or more, and particularly preferably 9,000 or more. The upper limit of Mw of the telechelic polymer is not particularly limited, but from the reason that the effects of the present invention are more excellent, it is preferably 500,000 or less and more preferably 100,000 or less.

Here, the weight-average molecular weight is measured by a gel permeation chromatograph method (GPC) and is obtained by converting with standard polystyrene. Specifically, for example, HLC-8220 GPC (manufactured by Tosoh Corporation) is used as GPC, three of TSKgeL SuperHZM-H, TSKgeL SuperHZ4000, and TSKgeL SuperHZ2000 (all manufactured by Tosoh Corporation, 4.6 mmID×15 cm) are used as a column, and tetrahydrofuran (THF) is used as an eluent. In addition, as the conditions, a sample concentration of 0.35% by mass, a flow rate of 0.35 mL/min, a sample injection amount of 10 μL, and a measurement temperature of 40° C. are set, and an IR detector is used. In addition, a calibration curve is created using 8 samples of "F-40", "F-20", "F-4", "F-1", "A-5000", "A-2500", "A-1000", and "n-propylbenzene" which are "Standard Samples TSK standard, polystyrene" (manufactured by TOSOH Corporation).

(HSP Value)

A Hansen solubility parameter (HSP) value of the telechelic polymer is not particularly limited, but from the reason that the effects of the present invention are more excellent, it is preferably 8 to 12, more preferably 8.5 to 11, and still more preferably 8.5 to 10.5.

(Content)

From the reason that the effects of the present invention are more excellent, a content of the telechelic polymer is preferably 1% to 50% by mass, more preferably 5% to 40% by mass, still more preferably 7% to 30% by mass, and particularly preferably 10% to 20% by mass with respect to the total mass of solid content in the photosensitive layer.

<Plasticizer>

From the reason that flexibility is improved, the photosensitive layer preferably contains a plasticizer.

Specific examples of the plasticizer include liquid rubber, oil, polyester, and phosphoric acid-based compounds.

Specific examples of the liquid rubber include liquid polybutadiene, liquid polyisoprene, and compounds in which these compounds are modified with maleic acid or an epoxy group.

Specific examples of the oil include paraffin, naphthene, and aroma.

Specific examples of the polyester include adipic acid-based polyester.

Specific examples of the phosphoric acid-based compound include phosphoric acid ester.

From the reason that the flexibility is further improved, a content of the plasticizer is preferably 0.1% to 40% by mass, and more preferably 5% to 30% by mass with respect to the total mass of solid content in the photosensitive layer.

<Surfactant>

From the viewpoint of improving the water developability, the photosensitive layer preferably contains a surfactant.

Examples of the surfactant include a cationic surfactant, an anionic surfactant, and a nonionic surfactant. Among these, from the reason that the effects of the present invention are more excellent, an anionic surfactant is preferable.

Specific examples of the anionic surfactant include

- aliphatic carboxylates such as sodium laurate, and sodium oleate;
- higher alcohol sulfate salts such as sodium lauryl sulfate, sodium cetyl sulfate, and sodium oleyl sulfate;
- polyoxyethylene alkyl ether sulfate ester salts such as sodium polyoxyethylene lauryl ether sulfate;
- polyoxyethylene alkyl allyl ether sulfate ester salts such as sodium polyoxyethylene octyl phenyl ether sulfate and sodium polyoxyethylene nonyl phenyl ether sulfate;
- alkyl sulfonates such as alkyl diphenyl ether disulfonate, sodium dodecyl sulfonate, and sodium dialkyl sulfosuccinate;
- alkyl allyl sulfonates such as alkyl disulfonate, sodium dodecyl benzene sulfonate, sodium dibutyl naphthalene sulfonate, and sodium triisopropyl naphthalene sulfonate;
- higher alcohol phosphate ester salts such as disodium lauryl phosphate monoester, and sodium lauryl phosphate diester; and
- polyoxyethylene alkyl ether phosphate ester salts such as disodium polyoxyethylene lauryl ether phosphate monoester, and sodium polyoxyethylene lauryl ether phosphate diester.

These may be used alone or in combination of two or more.

Among these, from the reason that the water developability is further improved, sulfonic acid-based surfactants such as alkyl sulfonate and alkyl allyl sulfonate are preferable.

From the viewpoint of developability and drying properties after development, a content of the surfactant is preferably 0.1% to 20% by mass, and more preferably 1% to 10% by mass with respect to the total mass of solid content in the photosensitive layer.

<Other Additives>

To the extent that the effects of the present invention are not impaired, other additives such as an ultraviolet absorber, a dye, a pigment, an anti-foaming agent, and a fragrance can be appropriately added to the photosensitive layer, for the purpose of improving various properties.

<Method for Producing Photosensitive Layer>

A method for producing the photosensitive layer is not particularly limited, and examples thereof include a method of preparing a resin composition containing each of the above-described components and applying the resin composition to the above-described support.

A film thickness of the photosensitive layer is preferably 0.01 to 10 mm and more preferably 0.2 to 6 mm.

[Interlayer]

As described above, the interlayer included in the flexographic printing plate precursor according to the embodiment of the present invention contains a rubber component and a resin component, and is a layer containing, as the resin component, at least one of an acrylic resin or a methacrylic resin.

<Rubber Component>

The rubber component contained in the interlayer is not particularly limited as long as it is a rubber which does not hinder adhesiveness with the above-described photosensitive layer and an infrared ablation layer described later.

Specific examples of the rubber include butadiene rubber (BR), acrylonitrile butadiene rubber (NBR), acrylic rubber, epichlorohydrin rubber, urethane rubber, isoprene rubber (IR), styrene isoprene rubber (SIR), styrene butadiene rubber (SBR), ethylene-propylene copolymer, and chlorinated polyethylene. These may be used alone or in combination of two or more.

Among these, from the reason that the adhesiveness with the adjacent photosensitive layer and infrared ablation layer is improved, butadiene rubber (BR), acrylonitrile butadiene rubber (NBR), or styrene butadiene rubber (SBR) is preferable, and acrylonitrile butadiene rubber (NBR) is more preferable.

A content of the rubber component is preferably 15% to 85% by mass, more preferably more than 20% by mass and less than 80% by mass, still more preferably 25% to 75% by mass, and particularly preferably 30% to 70% by mass with respect to the total mass of the rubber component and the resin component.

In the present invention, from the reason that the occurrence of wrinkles in the infrared ablation layer is further suppressed, it is preferable that a mass ratio (rubber component/resin component) of the rubber component to the resin component described later is in a range of 1/3 to 3/1. In particular, it is preferable that a mass ratio (rubber component/resin component) of the rubber component to the acrylic resin and the methacrylic resin in the resin component is in a range of 1/3 to 3/1.

<Resin Component>

The resin component contained in the interlayer is not particularly limited as long as it contains at least one of an acrylic resin or a methacrylic resin (hereinafter, abbreviated as "(meth)acrylic resin").

Here, the (meth)acrylic resin is not particularly limited as long as it is a polymer or a copolymer of one or more monomers selected from acrylic acid, methacrylic acid, acrylic acid ester, or methacrylic acid ester.

The resin component contained in the interlayer may contain a resin other than the (meth)acrylic resin.

Examples of the resin other than the (meth)acrylic resin include a polystyrene resin, a polyester resin, a polyamide resin, a polysulfone resin, a polyether sulfone resin, a polyimide resin, an acetal resin, an epoxy resin, and a polycarbonate resin.

A content of the resin component is preferably 15% to 85% by mass, more preferably more than 20% by mass and less than 80% by mass, still more preferably 25% to 75% by mass, and particularly preferably 30% to 70% by mass with respect to the total mass of the rubber component and the resin component.

In the present invention, from the reason that the occurrence of wrinkles in the infrared ablation layer is further suppressed, a glass transition temperature (Tg) of the resin component is preferably 48° C. to 80° C. and more preferably 60° C. to 70° C. In particular, a glass transition temperature of the (meth)acrylic resin in the resin component is preferably 48° C. to 80° C. and more preferably 60° C. to 70° C.

Here, the glass transition temperature is measured by using a differential scanning calorimeter [manufactured by Seiko Instruments Inc., product name: "DSC-6200" ] in accordance with JIS K 7121 (1987) (measuring method of transition temperature of plastic).

In the present invention, from the reason that the reproducibility of microcells is further improved in a case of being made into a flexographic printing plate, transferability of ink in a solid portion (particularly, applied area of 1 mm square or more) is improved, and a solid density is improved, it is preferable that the interlayer further contains at least one of an oxygen scavenging agent or inorganic layered particles.

<Oxygen Scavenging Agent>

Suitable examples of the oxygen scavenging agent include at least one compound selected from the group consisting of a phosphite compound, a phosphine compound, and a thioether compound.

Here, specific examples of the phosphite compound include monophosphite compounds such as triphenylphosphite, diphenylisodecylphosphite, phenyldiisodecylphosphite, tris(nonylphenyl)phosphite, tris(dinonylphenyl)phosphite, tris(2,4-di-t-butylphenyl)phosphite, 10-(3,5-di-t-butyl-4-hydroxybenzyl)-9,10-dihydro-9-oxa-10-phosphaphenanthrene-10-oxide, 6-[3-(3-t-butyl-4-hydroxy-5-methylphenyl)propoxy]-2,4,8,10-tetra-t-butyldibenz[d,f][1.3.2]dioxaphosphepine, and tridecylphosphite; and diphosphite compounds such as 4,4'-butylidene-bis(3-methyl-6-t-butylphenyl-di-tridecylphosphite) and 4,4'-isopropylidene-bis(phenyl-di-alkyl (C12 to C15) phosphite.

In addition, specific examples of the phosphine compound include triphenylphosphine and tris(2,6-dimethoxyphenyl) phosphine.

In addition, specific examples of the thioether compound include 3,6-dithia-1,8-octanediol and 2,2'-thiodiethanol.

In addition, in a case where the interlayer contains an oxygen scavenging agent, a content of the oxygen scavenging agent is preferably 0.05% to 5% by mass and more preferably 0.1% to 2% by mass with respect to the total mass of the rubber component and the resin component.

<Inorganic Layered Particles>

Suitable examples of the inorganic layered particles include at least one kind selected from the group consisting of mica, talc, teniolite, montmorillonite, saponite, hectorite, and zirconium phosphate.

Among these, mica is preferable, and fluorine-based swelling mica which is a synthetic inorganic lamellar compound is particularly used.

From the viewpoint of diffusion control, regarding a shape of the inorganic layered particles, the thickness is preferably thin, and the planar size is preferably large as long as the smoothness and actinic ray-transmitting properties of coating surfaces are not impaired.

Therefore, an aspect ratio of the inorganic layered particles is preferably 20 or more, more preferably 100 or more, and still more preferably 200 or more. The aspect ratio is the ratio of the major axis to the thickness of a particle and can be measured from projection views obtained from the microphotograph of the particles. As the aspect ratio increases, the obtained effect is stronger.

Regarding a particle size of the inorganic layered particles, an average major axis of the inorganic layered particles is preferably 0.3 to 20 μm, more preferably 0.5 to 10 μm, and still more preferably 1 to 5 μm.

In addition, an average thickness of the inorganic layered particles is preferably 0.1 μm or less, more preferably 0.05 μm or less, and still more preferably 0.01 μm or less. For example, a size of the swelling synthetic mica which is a typical compound of the inorganic layered particles has a thickness of 1 to 50 nm and a surface size of approximately 1 to 20 μm.

In addition, in a case where the interlayer contains inorganic layered particles, a content of the inorganic layered particles is preferably 10% to 80% by mass and more preferably 30% to 60% by mass with respect to the total mass of the rubber component and the resin component.

<Method for Producing Interlayer>

A method for producing the interlayer is not particularly limited, and examples thereof include a method of preparing a composition containing each of the above-described components and applying the composition to the above-described photosensitive layer.

A film thickness of the interlayer is preferably 0.1 to 6 μm and more preferably 0.2 to 3 μm.

[Infrared Ablation Layer]

The infrared ablation layer included in the flexographic printing plate precursor according to the embodiment of the present invention is a portion serving as a mask which covers the surface of the interlayer.

In addition, the infrared ablation layer is a portion which can be removed by an infrared laser, and the unremoved portion shields (absorbs) ultraviolet light to mask the interlayer and the photosensitive layer below the unremoved portion from not being irradiated with the ultraviolet light.

Such an infrared ablation layer can be formed using a resin composition containing a binder polymer and an infrared absorbing substance.

<Binder Polymer>

Examples of the binder polymer contained in the resin composition include the same polymer component as the rubber component and the resin component contained in the interlayer described above.

Among these, as the polymer component corresponding to the rubber component, butadiene rubber (BR), acrylonitrile butadiene rubber (NBR), or styrene butadiene rubber (SBR) is preferable, and acrylonitrile butadiene rubber (NBR) is more preferable.

In addition, as the polymer component corresponding to the resin component, a (meth)acrylic resin is preferable.

<Infrared Absorbing Substance>

The infrared absorbing substance contained in the resin composition is not particularly limited as long as it is a substance which can absorb infrared rays and convert the infrared rays into heat.

Specific examples of the infrared absorbing substance include black pigments (for example, carbon black, aniline black, cyanine black, and the like), green pigments (for example, phthalocyanine, naphthalocyanine, and the like), rhodamine coloring agents, naphthoquinone-based coloring agents, polymethine dyes, diimmonium salts, azoimonium-based coloring agents, chalcogen-based coloring agents, carbon graphite, iron powder, diamine-based metal complexes, dithiol-based metal complexes, phenolthiol-based metal complexes, mercaptophenol-based metal complexes, aryl aluminum metal salts, crystal water-containing inorganic compounds, copper sulfate, metal oxides (for example, cobalt oxide, tungsten oxide, and the like), and metal powders (for example, bismuth, tin, tellurium, aluminum, and the like).

Among these, from the viewpoint of having an ultraviolet absorbing function and the like, carbon black, carbon graphite, or the like is preferable.

The infrared ablation layer may contain various additives in addition to the binder polymer and the infrared absorbing substance described above.

Examples of such as additive include a surfactant, a plasticizer, an ultraviolet absorbing substance, a peeling agent, a dye, a pigment, an antifoaming agent, and a fragrance.

A method for producing the infrared ablation layer is not particularly limited, and examples thereof include a method of preparing a resin composition containing each of the above-described components and applying the resin composition to the above-described interlayer.

A film thickness of the infrared ablation layer is preferably 0.1 to 6 μm and more preferably 0.5 to 3 μm.

[Cover Sheet]

As shown in FIG. 1, the flexographic printing plate precursor according to the embodiment of the present invention may include a cover sheet.

Such a cover sheet is not particularly limited, but is preferably a transparent polymer film and may be one layer alone or two or more layers laminated.

Here, the "transparent" in the present invention means that a transmittance of visible light is 60% or more, preferably 80% or more and particularly preferably 90% or more.

Examples of a material of the polymer film include cellulose-based polymers; acrylic polymers having an acrylic acid ester polymer such as polymethyl methacrylate and a lactone ring-containing polymer; thermoplastic norbornene-based polymers; polycarbonate-based polymers; polyester-based polymers such as polyethylene terephthalate, polyethylene naphthalate, and a fluoropolyester polymer; styrene-based polymers such as polystyrene and an acrylonitrile-styrene copolymer (AS resin); polyolefin-based polymers such as polyethylene, polypropylene, an ethylene-propylene copolymer, and polybutadiene; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; acrylate-based polymers; polyoxymethylene-based polymers; epoxy-based polymers; and polymers obtained by mixing these polymers.

In addition, a surface (surface on which the infrared ablation layer is formed) of the cover sheet may be subjected to peeling treatment for suppressing adhesion of the infrared ablation layer and enhancing peelability of the cover sheet. Examples of such a peeling treatment include a method of applying a peeling agent to the surface of the cover sheet to form a peeling layer. Examples of the peeling agent include a silicone-based peeling agent and an alkyl-based peeling agent.

A film thickness of the cover sheet is preferably 25 to 250 μm.

[Manufacturing Method of Flexographic Printing Plate]

The manufacturing method of a flexographic printing plate according to the embodiment of the present invention is a manufacturing method of a flexographic printing plate having a non-image area and an image area, the manufacturing method including:

- a mask forming step of forming an image on the infrared ablation layer included in the above-described flexographic printing plate precursor according to the embodiment of the present invention to form a mask;
- an exposure step of, after the mask forming step, imagewise exposing the photosensitive layer included in the above-described flexographic printing plate precursor according to the embodiment of the present invention through the mask; and
- a development step of, after the above-described exposure step, performing development using a developer to form a non-image area and an image area.

[Mask Forming Step]

The above-described mask forming step is a step of forming an image on the infrared ablation layer to form a mask to be used in the exposure step described later.

Here, in the infrared ablation layer, in a case of being irradiated with an infrared laser, the action of the infrared absorbing substance generates heat, which decomposes the infrared ablation layer to be removed, that is, to laser-ablate the infrared ablation layer.

Therefore, by selectively laser-ablating the infrared ablation layer based on the image data, it is possible to obtain an image mask capable of forming a latent image on the photosensitive layer.

For the infrared laser irradiation, an infrared laser having an oscillation wavelength in a range of 750 nm to 3000 nm is used.

Examples of such a laser include a solid-state laser such as a ruby laser, an Alexandrite laser, a perovskite laser, an Nd-YAG laser, and an emerald glass laser; a semiconductor laser such as InGaAsP, InGaAs, and GaAsAl; and a coloring agent laser such as a Rhodamine coloring agent.

In addition, a fiber laser which amplifies these light sources with a fiber can also be used.

Among these, from the viewpoint that the sensitivity of the infrared ablation layer is increased, it is preferable to use an exposure light source having an oscillation wavelength of 900 to 1200 nm, and it is more preferable to use a fiber laser.

[Exposure Step]

The above-described exposure step is a step of imagewise exposing the photosensitive layer through the mask obtained in the above-described mask forming step, and by imagewise irradiating the photosensitive layer with ultraviolet rays, crosslinking and/or polymerization of regions irradiated with the ultraviolet rays can be induced to be cured.

[Development Step]

The above-described development step is a step of performing development using a developer to form a non-image area and an image area.

The developer used in the above-described development step is not particularly limited, and known developer in the related art can be used. However, from the viewpoint of reducing the environmental load, it is preferable to use a developer containing 50% by mass or more of water (hereinafter, also abbreviated as "aqueous developer"). The developer may be an aqueous solution or a suspension (for example, an aqueous dispersion liquid).

In addition, a content of water contained in the aqueous developer is preferably 80% to 99.99% by mass and more preferably 90% to 99.9% by mass with respect to the total mass of the aqueous developer.

[Rinse Step]

It is preferable that the manufacturing method of a flexographic printing plate according to the embodiment of the present invention includes a rinse step of, after the above-described development step, rinsing surfaces of the non-image area and the image area formed in the above-described development step with water.

As a rinsing method in the rinse step, a method of washing with tap water, a method of spraying high pressure water, a method of rubbing the surfaces of the non-image area and the image area with a brush using a batch-type or transport-type brush-type washing machine as a developing machine for flexographic printing plates mainly in the presence of water, and the like may be used.

EXAMPLES

Hereinafter, the present invention will be described in more detail with reference to examples. Materials, amounts used, ratios, treatment contents, treatment procedures, and the like shown in the following examples can be appropriately changed without departing from the spirit of the present invention. Therefore, the scope of the present invention should not be construed as being limited by the following examples.

Example 1

[Preparation of Composition for Forming Photosensitive Layer]

63.6 parts by mass of a water-dispersible latex (Nipol LX111NF, water-dispersible latex of polybutadiene, solid content: 55%, manufactured by ZEON CORPORATION), 10 parts by mass of a telechelic polymer (BAC-45, manufactured by OSAKA ORGANIC CHEMICAL INDUSTRY LTD.; polybutadiene having acryloyloxy groups at both terminals, Mw=10,000), and 8.7 parts by mass of 1,9-nonanediol dimethacrylate (NK ESTER NOD-N, manufactured by Shin-Nakamura Chemical Co., Ltd.) were mixed with each other, and moisture was evaporated for 3 hours in a dryer heated to 60° C. to obtain a mixture containing water-dispersible particles.

The mixture, 20 parts by mass of butadiene rubber (NF35R, manufactured by Asahi Kasei Co., Ltd.), 15 parts by mass of a plasticizer (Diana Process Oil PW-32, manufactured by Idemitsu Kosan Co., Ltd.), and 4.4 parts by mass of a surfactant (RAPISOL A-90, effective content: 90%, manufactured by NOF CORPORATION) were kneaded in a kneader set at 110° C. for 45 minutes. Thereafter, 0.2 parts by mass of a thermal polymerization inhibitor and 3 parts by mass of a photopolymerization initiator (benzyl dimethyl ketal, manufactured by Tokyo Chemical Industry Co. Ltd.) were put into the kneader, and the mixture was kneaded for 5 minutes to prepare a composition for forming a photosensitive layer.

[Preparation of Composition for Forming Infrared Ablation Layer]

100 parts by mass of carbon black and 3 parts by mass of a plasticizer were added to 100 parts by mass of a binder polymer consisting of 50 parts by mass of an acrylic resin A (Hi-pearl M5000, Tg: 65° C., manufactured by Negami Chemical Industrial Co., Ltd.) and 50 parts by mass of NBR, and 812 parts by mass of methyl isobutyl ketone as a solvent was further added thereto, the mixture was mixed by stirring with blades. The obtained mixed solution was dispersed using a three-roll mill, and then methyl isobutyl ketone was further added thereto so that the solid content was 15% by mass to prepare a composition for forming an infrared ablation layer.

[Preparation of Composition for Forming Interlayer]

3 parts by mass of a plasticizer was added to a total of 100 parts by mass of 50 parts by mass of an acrylic resin A (Hi-pearl M5000, Tg: 65° C., manufactured by Negami Chemical Industrial Co., Ltd.) as a resin component and 50 parts by mass of NBR as a rubber component, and 812 parts by mass of methyl isobutyl ketone as a solvent was further added thereto, the mixture was mixed by stirring with blades. The obtained mixed solution was dispersed using a three-roll mill, and then methyl isobutyl ketone was further added thereto so that the solid content was 15% by mass to prepare a composition for forming an interlayer.

[Production of Flexographic Printing Plate Precursor]

The composition for forming an infrared ablation layer was applied onto a 125 μm-thick PET film (cover sheet), which had been coated with a silicone-based peeling agent, with a bar coater so that a thickness of a coating film after drying was 1 μm, and dried at 120° C. for 5 minutes to obtain a laminate X consisting of infrared ablation layer/cover sheet.

Next, the composition for forming an interlayer was applied onto a 125 μm-thick PET film (cover sheet), which had been coated with a silicone-based peeling agent, with a bar coater so that a thickness of a coating film after drying was 1 μm, and dried at 120° C. for 5 minutes to obtain a laminate Y consisting of interlayer/cover sheet.

Next, a surface of the laminate X on which the infrared ablation layer was formed and a surface of the laminate Y on which the interlayer was formed were laminated together, and then pressed with a press machine heated to 120° C. so that a thickness was 2 μm to obtain a laminate Z in which the cover sheet, the infrared ablation layer, the interlayer, and the cover sheet were laminated in this order.

Next, the cover sheet of the surface of the interlayer in the laminate Z was peeled off, the composition for forming a photosensitive layer was sandwiched between the adhesive-coated surface of a support, which is obtained by coating a surface of a 125 μm-thick PET film (base material) with an adhesive, and then pressed with a press machine heated to 120° C. so that a thickness of the composition for forming a photosensitive layer was 1.5 mm, thereby producing a flexographic printing plate precursor of Example 1, in which the support, the photosensitive layer, the interlayer, the infrared ablation layer, and the cover sheet were laminated in this order.

Examples 2 to 12, Comparative Examples 1 and 2, and Reference Example 1

A flexographic printing plate precursor was produced according to the same procedure as in Example 1, except that the type and content (% by mass) of each component in the interlayer were changed as shown in Table 1 below.

[Evaluation]

[Microcell Reproducibility]

The obtained flexographic printing plate was evaluated for microcell reproducibility by the following method.

First, using a hybrid laser microscope OPTELICS (registered trademark) HYBRIDE (manufactured by Lasertec Corporation), a confocal measurement was performed on a surface of the solid image area of the flexographic printing plate in increments of 0.1 μm in height with a 50× Apo objective lens (high numerical aperture (high NA)) to obtain three-dimensional data. An evaluation range was defined as a region of 300 μm in length and 300 μm in width.

From the observation image based on the above-described three-dimensional data, 100 or more convex portions were observed, and the number of reproduced portions without chipping was determined.

Next, an image reproduction % was calculated by the following expression.

Image reproduction %=(Number of reproduced convex portions without chipping)/(Number of evaluations)×100

The evaluation was performed using the following standards. The results are shown in Table 1 below.

In order to obtain a printed article having a higher solid density, the image reproduction of the microcells is preferably C to A, more preferably B or A, and still more preferably A. In a case where the image reproduction was less than 80%, unevenness of the ink transferred to the printed article was large, and the solid density was deteriorated.

<Evaluation Standard> 2

A: image reproduction was 98% or more.

B: image reproduction was 90% or more and less than 98%.

C: image reproduction was 80% or more and less than 90%.

D: image reproduction was less than 80%.

[Suppression of Occurrence of Wrinkles in Infrared Ablation Layer]

The cover sheet of the produced flexographic printing plate precursor was peeled off, each of cylindrical cylinders with a diameter of 170 mm and a diameter of 130 mm was wound with the flexographic printing plate, such that the infrared ablation layer was on the outside, and fixed for 10 minutes, and then the flexographic printing plate precursor was removed and placed on a flat place for 10 minutes. Thereafter, the surface of the infrared ablation layer was visually observed.

The results are shown in Table 1 below. Practically, C to A are preferable, B or A is more preferable, and A is still more preferable.

<Evaluation Standard>

A: no fissuring and wrinkles were confirmed with the cylinder with a diameter of 130 mm.

B: no fissuring and wrinkles were confirmed with the cylinder with a diameter of 170 mm.

C: some wrinkles remained with the cylinder with a diameter of 170 mm.

D: fissuring and wrinkles were confirmed with the cylinder with a diameter of 170 mm.

[Solid Density]

Solid density of the obtained flexographic printing plate was evaluated by the following method.

A flexographic printing machine (manufactured by TAIYO KIKAI Ltd., TLF-270) was used as a printing machine. The obtained flexographic printing plate was attached to a plate cylinder (drum) through a cushion tape (manufactured by Lohmann), and installed in the printing machine. Thereafter, a kiss-touch (printing pressure at which the entire surface of the image started to be inked) was set to 0 (reference printing pressure), and from there, printing was performed at a printing speed of 150 m/min under the condition of pushing in 80 μm. A printed material used for the evaluation was pushed 5,000 times under the above-described conditions, and then sampled. As the printed material, a 50 μm OPP film (manufactured by ABE Paper Corporation) was used. In addition, as an ink, water-based flexo ink HYDRIC FCF (manufactured by Dainichiseika Color & Chemicals Mfg. Co., Ltd.) cyan was used.

A density of the solid image area to which the microcells were applied in the object to be printed was measured with a spectrocolorimeter eXact (manufactured by X-Rite, Incorporated), and evaluated according to the following standard.

The results are shown in Table 1 below. Practically, C to A are preferable, B or A is more preferable, and A is still more preferable.

<Evaluation Standard>

A: 1.80 or more

B: 1.70 or more and less than 1.80

C: 1.60 or more and less than 1.70

D: less than 1.60

<Printing Durability>

Printing durability of the obtained flexographic printing plate was evaluated by the following method.

A flexographic printing machine (manufactured by TAIYO KIKAI Ltd., TLF-270) was used as a printing machine. The obtained flexographic printing plate was attached to a plate cylinder (drum) through a cushion tape (manufactured by Lohmann), and installed in the printing machine. Thereafter, a kiss-touch (printing pressure at which the entire surface of the image started to be inked) was set to 0 (reference printing pressure), and from there, printing was performed at a printing speed of 150 m/min under the condition of pushing in 80 μm. A printed material used for the evaluation was sampled up to 25 km every 5 km under the above-described conditions. As the printed material, Aurora Coat 84.9 g/m$^2$ (manufactured by Nippon Paper Industries Co., Ltd.) was used. In addition, as an ink, water-based flexo ink HYDRIC FCF (manufactured by Dainichiseika Color & Chemicals Mfg. Co., Ltd.) was used.

The number of chippings in a 2% halftone dot image area in the printed material was measured. A printing distance in which 25 of 4746 halftone dots were chipped at the start was set as an end point, and a distance to the end point was evaluated according to the following standard.

The results are shown in Table 1 below. Practically, C to A are preferable, B or A is more preferable, and A is still more preferable.

<Evaluation Standard>

A: 25 km or more

B: 20 km or more and less than 25 km

C: 15 km or more and less than 20 km

D: less than 15 km

TABLE 1

| | | | | Example | | | | | | | | | | | | Comparative Example | | Reference Example |
|---|---|---|---|---|---|---|---|---|---|---|---|---|---|---|---|---|---|---|
| | | | | 1 | 2 | 3 | 4 | 5 | 6 | 7 | 8 | 9 | 10 | 11 | 12 | 1 | 2 | 1 |
| Layer configuration | Infrared ablation layer | Binder polymer | NBR | 50 | 50 | 50 | 50 | 50 | 50 | 50 | 50 | 50 | 50 | 50 | 50 | 50 | 50 | 50 |
| | | | Acrylic resin A (Tg: 65° C.) | 50 | 50 | 50 | 50 | 50 | 50 | 50 | 50 | 50 | 50 | 50 | 50 | 50 | 50 | 50 |
| | Interlayer | Rubber component | NBR | 50 | 75 | 25 | 80 | 20 | 50 | | | 50 | 50 | 50 | 50 | | | |
| | | | BR | | | | | | | 50 | | | | | | | | |
| | | | SBR | | | | | | | | 50 | | | | | | | |
| | | Resin component | Acrylic resin A (Tg: 65° C.) | 50 | 25 | 75 | 20 | 80 | 50 | 50 | 50 | 50 | 50 | 50 | | | | |
| | | | Acrylic resin B (Tg: 85° C.) | | | | | | | | | | | | 50 | | | |
| | | | PVA | | | | | | | | | | | | | | 100 | |

TABLE 1-continued

| | | | Example | | | | | | | | | | | | Comparative Example | | Reference Example |
|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 1 | 2 | 1 |
| | Oxygen scavenging agent | Triphenyl-phosphine | | | | | | 0.5 | 0.5 | 0.5 | 0.5 | | | | | | |
| | | Tris (nonylphenyl) phosphite | | | | | | | | | | 0.5 | | | | | |
| | Inorganic layered particles | Mica | | | | | | | | | | | 50 | | | | |
| Photo-sensitive layer | Binder | BR | 23 | 23 | 23 | 23 | 23 | 23 | 23 | 23 | 23 | 23 | 23 | 23 | 23 | 23 | 23 |
| | Water-dispersible particles | BR latex | 32 | 32 | 32 | 32 | 32 | 32 | 32 | 32 | 32 | 32 | 32 | 32 | 32 | 32 | 32 |
| | Oxygen scavenging agent | Triphenyl-phosphine | | | | | | | | | | | | | | | 0.5 |
| | Monomer | | 8.7 | 8.7 | 8.7 | 8.7 | 8.7 | 8.7 | 8.7 | 8.7 | 8.7 | 8.7 | 8.7 | 8.7 | 8.7 | 8.7 | 8.7 |
| | Photopolymerization initiator | | 7.8 | 7.8 | 7.8 | 7.8 | 7.8 | 7.8 | 7.8 | 7.8 | 7.8 | 7.8 | 7.8 | 7.8 | 7.8 | 7.8 | 7.8 |
| | Polymerization inhibitor | | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| Evaluation | Reproducibility of microcells | | C | C | C | C | C | A | B | A | A | A | A | A | D | A | A |
| | Suppression of occurrence of wrinkles in infrared ablation layer | | A | A | A | B | B | A | A | A | A | A | A | B | A | D | A |
| | Solid density | | C | C | C | C | C | A | B | A | A | A | A | A | D | A | A |
| | Printing durability | | A | A | A | A | A | A | B | A | A | A | A | A | A | A | D |

Components in Table 1 are shown below.

<Infrared Ablation Layer>

NBR: NIPOL 1042 (manufactured by ZEON CORPORATION)

Acrylic resin A (Tg: 65° C.): Hi-pearl M5000 (manufactured by Negami Chemical Industrial Co., Ltd.)

<Interlayer>

NBR: NIPOL 1042 (manufactured by ZEON CORPORATION)

BR: NF35R (manufactured by Asahi Kasei Co., Ltd.)

SBR: Tufdene 2100 (manufactured by Asahi Kasei Co., Ltd.)

Acrylic resin A (Tg: 65° C.): Hi-pearl M5000 (manufactured by Negami Chemical Industrial Co., Ltd.)

Acrylic resin B (Tg: 85° C.): Pre-coat 200 (manufactured by Negami Chemical Industrial Co., Ltd.)

PVA: Kuraray Poval PVA505 (manufactured by Kuraray)

Triphenylphosphine: reagent manufactured by Tokyo Chemical Industry Co., Ltd.

Tris(nonylphenyl)phosphite: reagent manufactured by Sigma-Aldrich Co. LLC

Mica: synthetic mica Somashift ME-100 (manufactured by Co-op Chemical Co., Ltd.)

<Photosensitive Layer>

Binder: BR (NF35R, manufactured by Asahi Kasei Co., Ltd.)

Water-dispersible particles: BR latex (Nipol LX111NF, water-dispersible latex of polybutadiene, solid content: 55%, manufactured by ZEON CORPORATION)

Oxygen scavenging agent: triphenylphosphine (reagent manufactured by Tokyo Chemical Industry Co., Ltd.)

Monomer: 1,9-nonanediol dimethacrylate (NK ESTER NOD-N, manufactured by Shin-Nakamura Chemical Co., Ltd.)

Photopolymerization initiator: benzyl dimethyl ketal (manufactured by Tokyo Chemical Industry Co., Ltd.)

Polymerization inhibitor: dibutylhydroxytoluene (manufactured by Tokyo Chemical Industry Co., Ltd.)

From the results shown in Table 1, it was found that, in a case where the interlayer was not provided, the reproducibility of the microcells was deteriorated and the solid density was also low (Comparative Example 1).

In addition, it was found that, in a case where the oxygen blocking layer described in WO2017/056763A was provided as the interlayer, the wrinkles occurred in the infrared ablation layer as described above (Comparative Example 2).

In addition, it was found that, in a case where the oxygen scavenging agent was introduced into the photosensitive layer instead of providing the interlayer, the occurrence of wrinkles in the infrared ablation layer was suppressed and the reproducibility of the microcells was improved in a case of being made into a flexographic printing plate, but the printing durability was deteriorated and it was difficult to put it into practical use (Reference Example 1).

On the other hand, it was found that, by providing the interlayer containing the rubber component and the resin component and containing, as the resin component, at least one of an acrylic resin or a methacrylic resin, the occurrence of wrinkles in the infrared ablation layer was suppressed and the reproducibility of the microcells was improved in a case of being made into a flexographic printing plate (Examples 1 to 12). The solid density and the printing durability of Examples 1 to 12 were at a level which could be put into practical use.

In addition, from the comparison between Example 1 and Examples 6 to 11, it was found that, in a case where the interlayer further contained at least one of the oxygen scavenging agent or the inorganic layered particles, the reproducibility of microcells was further improved in a case of being made into a flexographic printing plate and the solid density was improved.

In addition, from the comparison of Examples 1 to 5, it was found that, in a case where the mass ratio (rubber component/resin component) of the rubber component to the resin component was in a range of 1/3 to 3/1, the occurrence of wrinkles in the infrared ablation layer could be further suppressed.

In addition, from the comparison between Example 1 and Example 12, it was found that, in a case where the glass transition temperature (Tg) of the resin component contained in the interlayer was 48° C. to 80° C., the occurrence of wrinkles in the infrared ablation layer could be further suppressed.

EXPLANATION OF REFERENCES

1: support
2: photosensitive layer
3: interlayer
4: infrared ablation layer
5: cover sheet
10: flexographic printing plate precursor

What is claimed is:

1. A flexographic printing plate precursor comprising, in the following order:

a support;
a photosensitive layer;
an interlayer; and
an infrared ablation layer,
wherein the interlayer contains a rubber component, a resin component and an oxygen scavenging agent, and
the resin component contains at least one of an acrylic resin or a methacrylic resin.

2. The flexographic printing plate precursor according to claim 1, wherein the interlayer further contains inorganic layered particles.

3. The flexographic printing plate precursor according to claim 2, wherein the inorganic layered particles are at least one kind selected from the group consisting of mica, talc, teniolite, montmorillonite, saponite, hectorite, and zirconium phosphate.

4. The flexographic printing plate precursor according to claim 3, wherein a glass transition temperature of the resin component is 48° C. to 80° C.

5. The flexographic printing plate precursor according to claim 3, wherein a mass ratio of the rubber component to the resin component is in a range of 1/3 to 3/1.

6. The flexographic printing plate precursor according to claim 2, wherein a glass transition temperature of the resin component is 48° C. to 80° C.

7. The flexographic printing plate precursor according to claim 2, wherein a mass ratio of the rubber component to the resin component is in a range of 1/3 to 3/1.

8. The flexographic printing plate precursor according to claim 1, wherein the oxygen scavenging agent is at least one compound selected from the group consisting of a phosphite compound, a phosphine compound, and a thioether compound.

9. The flexographic printing plate precursor according to claim 8, wherein a glass transition temperature of the resin component is 48° C. to 80° C.

10. The flexographic printing plate precursor according to claim 8, wherein a mass ratio of the rubber component to the resin component is in a range of 1/3 to 3/1.

11. The flexographic printing plate precursor according to claim 1, wherein a glass transition temperature of the resin component is 48° C. to 80° C.

12. The flexographic printing plate precursor according to claim 11, wherein a mass ratio of the rubber component to the resin component is in a range of 1/3 to 3/1.

13. The flexographic printing plate precursor according to claim 1, wherein a mass ratio of the rubber component to the resin component is in a range of 1/3 to 3/1.

14. A manufacturing method of a flexographic printing plate having a non-image area and an image area, the manufacturing method comprising:

a mask forming step of, with respect to the flexographic printing plate precursor according to claim 1, forming an image on the infrared ablation layer included in the flexographic printing plate precursor to form a mask;
an exposure step of, after the mask forming step, imagewise exposing the photosensitive layer included in the flexographic printing plate precursor through the mask; and
a development step of, after the exposure step, performing development using a developer to form a non-image area and an image area.

15. A manufacturing method of a flexographic printing plate having a non-image area and an image area, the manufacturing method comprising:

a mask forming step of, with respect to the flexographic printing plate precursor according to claim 2, forming an image on the infrared ablation layer included in the flexographic printing plate precursor to form a mask;
an exposure step of, after the mask forming step, imagewise exposing the photosensitive layer included in the flexographic printing plate precursor through the mask; and
a development step of, after the exposure step, performing development using a developer to form a non-image area and an image area.

16. A manufacturing method of a flexographic printing plate having a non-image area and an image area, the manufacturing method comprising:

a mask forming step of, with respect to the flexographic printing plate precursor according to claim 8, forming an image on the infrared ablation layer included in the flexographic printing plate precursor to form a mask;
an exposure step of, after the mask forming step, imagewise exposing the photosensitive layer included in the flexographic printing plate precursor through the mask; and
a development step of, after the exposure step, performing development using a developer to form a non-image area and an image area.

17. A manufacturing method of a flexographic printing plate having a non-image area and an image area, the manufacturing method comprising:

a mask forming step of, with respect to the flexographic printing plate precursor according to claim 3, forming an image on the infrared ablation layer included in the flexographic printing plate precursor to form a mask;

an exposure step of, after the mask forming step, imagewise exposing the photosensitive layer included in the flexographic printing plate precursor through the mask; and a development step of, after the exposure step, performing development using a developer to form a non-image area and an image area.

18. A manufacturing method of a flexographic printing plate having a non-image area and an image area, the manufacturing method comprising:

a mask forming step of, with respect to the flexographic printing plate precursor according to claim 11, forming an image on the infrared ablation layer included in the flexographic printing plate precursor to form a mask;

an exposure step of, after the mask forming step, imagewise exposing the photosensitive layer included in the flexographic printing plate precursor through the mask; and a development step of, after the exposure step, performing development using a developer to form a non-image area and an image area.

19. A manufacturing method of a flexographic printing plate having a non-image area and an image area, the manufacturing method comprising:

a mask forming step of, with respect to the flexographic printing plate precursor according to claim 13, forming an image on the infrared ablation layer included in the flexographic printing plate precursor to form a mask;

an exposure step of, after the mask forming step, imagewise exposing the photosensitive layer included in the flexographic printing plate precursor through the mask; and a development step of, after the exposure step, performing development using a developer to form a non-image area and an image area.

* * * * *